(12) United States Patent
Agarwal (10) Patent No.: US 6,306,754 B1
(45) Date of Patent: Oct. 23, 2001

(54) METHOD FOR FORMING WIRING WITH EXTREMELY LOW PARASITIC CAPACITANCE

(75) Inventor: Vishnu K. Agarwal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/342,212

(22) Filed: Jun. 29, 1999

(51) Int. Cl.[7] .................. H01L 21/76; H01L 21/4763; H01L 21/44
(52) U.S. Cl. ............... 438/619; 438/411; 438/421; 438/623; 438/633; 438/686; 438/687
(58) Field of Search .................. 438/619, 623, 438/626, 633, 686–687, 411, 421; 257/759, 765

(56) References Cited

U.S. PATENT DOCUMENTS

| | | | |
|---|---|---|---|
| 4,944,837 | * 7/1990 | Nishikawa et al. | 156/646 |
| 5,103,288 | * 4/1992 | Sakamoto et al. | 357/71 |
| 5,185,296 | * 2/1993 | Morita et al. | 437/229 |
| 5,409,683 | 4/1995 | Tillotson et al. | 423/338 |
| 5,461,003 | 10/1995 | Havemann et al. | 437/187 |
| 5,668,398 | 9/1997 | Havemann et al. | 257/522 |
| 5,747,880 | * 5/1998 | Havemann et al. | 257/759 |
| 5,750,415 | 5/1998 | Gnade et al. | 437/195 |
| 5,837,630 | 11/1998 | Owens et al. | 501/80 |
| 5,879,744 | 3/1999 | Cao et al. | 427/248.1 |
| 5,880,026 | 3/1999 | Xing et al. | 438/688 |
| 6,063,714 | * 5/2000 | Smith et al. | 438/778 |

OTHER PUBLICATIONS

List R.S., et al. Integration of Ultra–Low–K Xerogel Gapfill Dielectric for High Performance Sub–0.18 um Interconnects—pp. 77–78, 1997, Symposium on VLSI Technology Digest of Technical Papers.

* cited by examiner

Primary Examiner—John F. Niebling
Assistant Examiner—Ha Tran Nguyen
(74) Attorney, Agent, or Firm—Dickstein Shapiro Morin & Oshinsky LLP (57) ABSTRACT

A method for creating metal layers in a microelectronic device where air is the primary dielectric separating adjacent metal features within a layer. A temporary structural solid, such as a photoresist, is deposited on a substrate with exposed metal features. The photoresist is etched back to expose at least the top surfaces of the metal features. A porous dielectric is then deposited on the substrate and cured to stabilize the structure. The substrate is then treated with a supercritical fluid, such as supercritical $CO_2$, to extract the photoresist through the pores of the porous dielectric layer.

87 Claims, 4 Drawing Sheets

METHOD FOR FORMING WIRING WITH EXTREMELY LOW PARASITIC CAPACITANCE

FIELD OF THE INVENTION

This invention relates generally to the fabrication of semiconductor devices and more particularly to the use of air gaps as a low-dielectric constant material between metal lines and features.

BACKGROUND OF THE INVENTION

The trend in the semiconductor industry toward smaller devices and more densely packed designs on microelectronic substrates continues to create new challenges. One of the more recent obstacles to improvements in device performance is the need to reduce the dielectric constant of the materials between closely packed metal lines in a metallization layer. Metal lines in close proximity within a metallization layer have a parasitic capacitance which can lead to 'cross-talk' between lines as well as slower device performance.

One method for reducing the parasitic capacitance between nearby metal lines is to reduce the effective dielectric constant between the metal lines. Ideally, the dielectric constant between the metal lines could be reduced to 1, the dielectric constant of vacuum and the theoretical minimum. Traditionally the space between metal lines has been filled with $SiO_2$, which typically exhibits dielectric constants between 3.5–4.0. All of the technological problems associated with working with $SiO_2$ are well-characterized, so $SiO_2$ provides a convenient material as the interlayer dielectric. $SiO_2$ also has the necessary structural integrity to support the multiple levels present in modern multi-level metallization stacks used to connect densely packed devices.

One potential solution to the parasitic capacitance problem is the use of porous $SiO_2$ instead of $SiO_2$ as the dielectric. Porous $SiO_2$ structures are partially composed of air due to the presence of a network of pores running throughout the structure. Depending on the percentage of the total volume occupied by the pores, porous $SiO_2$ layers can have dielectric constants approaching 2.

Due to difficulties in forming porous $SiO_2$ layers, however, it is difficult to consistently reproduce the lowest dielectric constant values. Porous dielectric layers are typically deposited by spin-on techniques. The initial deposition material is an alcohol-based solution with solvated 'monomer' units, such as silicon alkoxides, which will eventually form the porous dielectric. After deposition of the alcohol solution, a reaction is induced between the monomer units, eventually resulting in the formation of the porous dielectric. The pore size and total pore density can be controlled by controlling the reaction conditions during formation of the porous layer. At this point, however, the porous dielectric is still saturated with the alcohol solvent used for the initial deposition. This solvent must be carefully extracted to avoid disruption of the porous dielectric. Due to surface tension effects, simple evaporation of the solvent by heating will often result in degradation of the porous dielectric.

Many techniques for extracting the solvent involve replacing the alcohol with a lower surface tension solvent. Other techniques involve increasing the temperature and pressure on the porous dielectric to beyond the critical point of the alcohol. While removing the supercritical alcohol leads to much less damage to the porous dielectric layer, the pressure and temperature conditions required to convert the alcohol into a supercritical fluid are quite severe. An interesting combination of the above techniques has been to use supercritical $CO_2$. $CO_2$ becomes a supercritical fluid under much less severe conditions than most alcohols, and supercritical $CO_2$ is a suitable solvent for most alcohols.

Air is potentially a desirable dielectric for use between metal lines. The dielectric constant of air is very close to one, providing nearly the minimum possible value. Maintaining air gaps between nearby metal lines in a multi-level metallization stack, however, poses severe problems from a processing standpoint. Generally, creation of metal levels involves a number of steps, including depositions of blanket layers of metal or dielectric, etching processes to transfer patterns, and planarization and etchback processes to achieve layers of specified thickness and uniformity. Obviously, any gaps between metal lines which are exposed during deposition of a blanket layer will be filled in by the blanket layer.

U.S. Pat. No. 5,461,003 discloses a method for creating air gaps between metal leads in metallization layers. In this invention, after metal leads are formed on a substrate, the space between the leads is filled by depositing a polymer solid. After the polymer solid is etched back to below the tops of the metal leads, a porous dielectric is deposited on the substrate. The polymer solid is then removed through the porous dielectric by one of several methods, including dissolution with a solvent such as acetone, chemical ashing with oxygen, or volatilization with heat.

The above techniques are only partially effective at creating the desired air gap structures. Methods of removing the polymer solid by use of a solvent or solvent vapor suffer from the extremely low diffusivity of the solvent through the pores of the porous dielectric. As a result, the extraction efficiency of the polymer solid is low, leading to incomplete removal of the polymer solid and/or poor throughput. Methods involving chemical ashing with $O_2$ are not compatible with all types of metal lines and features which might be present in a metallization stack. $O_2$ will attack Cu, resulting in increased resistance in metal lines. Barrier layers may also be attacked, including layers composed of TiN, $TiSi_2$, and WN. As a result, chemical ashing of the polymer solid to remove the polymer as CO or $CO_2$ can often lead to increased resistance in metal lines and features.

Due to the difficulties encountered in the prior art, a need remains for an effective method of creating air gaps between metal lines in multi-level metallization stacks in microelectronic devices.

SUMMARY OF THE INVENTION

The present invention provides a method for creating multi-level metallization structures with air as the dielectric material between adjacent metal lines. The air gaps between the metal lines are created while leaving behind a minimum amount of residue in the air gap and with a minimum of damage to the metal lines.

After creating metal lines or features on a substrate, a blanket layer of a temporary structural solid, such as a photoresist, is deposited on the substrate. After deposition, the temporary structural solid is etched back so that at least the tops of the metal lines are exposed. A blanket layer of porous dielectric is then formed on the substrate over the metal features and the temporary structural solid. The substrate is then treated with a supercritical fluid, such as supercritical $CO_2$. The supercritical fluid diffuses through the pores of the porous dielectric and dissolves the temporary structural solid. The dissolved temporary structural solid is transported out through the pores, leaving behind a minimum of residue between the metal lines with a minimum of damage to the metal lines.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that structural, logical and electrical changes may be made without departing from the spirit and scope of the present invention.

The terms "wafer" and "substrate" are to be understood as including any semiconductor-based structure which may be beneficially treated by the process of this invention. "Wafer" or "substrate" may include silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The following detailed description is, therefore, not to be taken in a limiting sense, and the scope of the present invention is defined by the appended claims.

Figure 1:
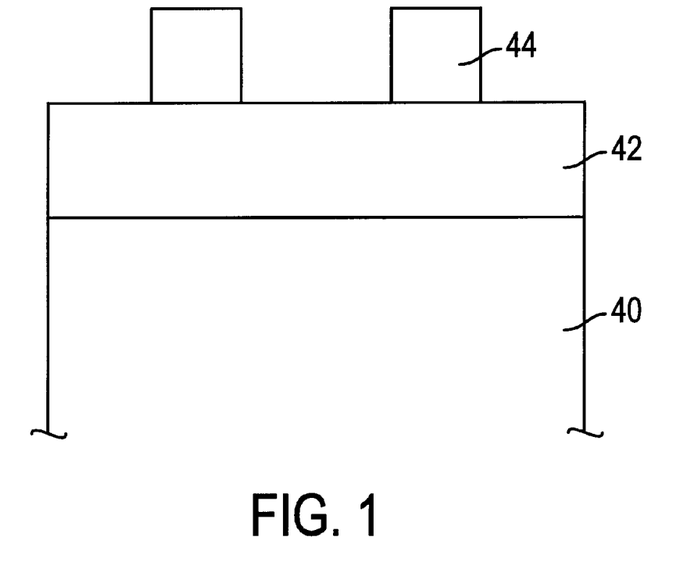
FIG. 1 is a schematic cross-sectional view of a substrate undergoing the process of a preferred embodiment of the invention.

The present invention provides a method for creating metallization levels with reduced parasitic capacitance between nearby metal lines or features. Referring now to the drawings, where like elements are designated by like reference numerals, FIG. 1 depicts a semiconductor wafer 40 in an intermediate processing stage where metal lines 44 have already been created on the surface. The metal lines 44, or other potential metal features which are not shown, sit on top of dielectric layer 42. The metal lines 44 are connected to devices present at lower levels of the substrate by vias or other interconnects (not shown).

The metal lines 44, or other potential metal features, may be composed of aluminum, copper, tungsten, or other metals or alloys which are suitable for creating metal features in microelectronic devices. The metal lines 44 may be formed by depositing a blanket layer of metal, depositing photoresist, patterning the photoresist, and then wet etching the metal with the patterned photoresist acting as an etch mask. Other methods suitable for forming metal lines or features for this invention will be apparent to those skilled in the art.

Figure 2:
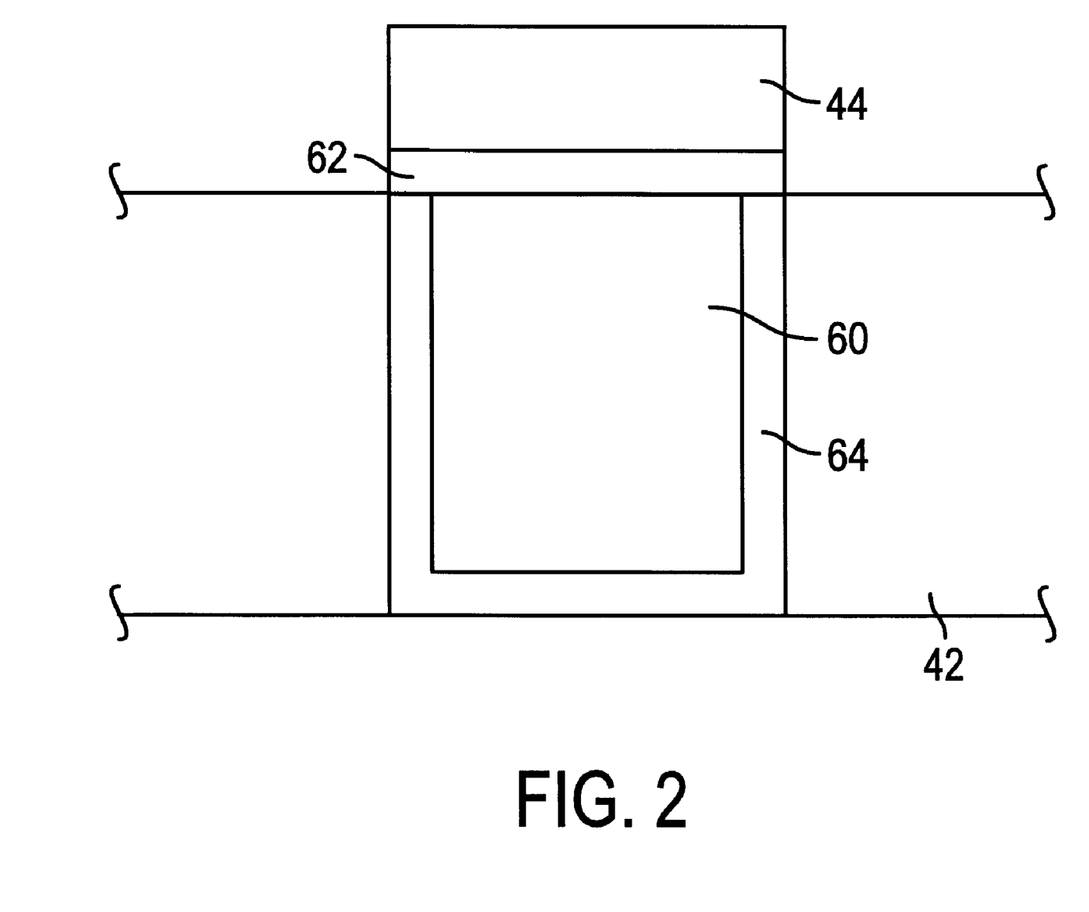
FIG. 2 is a more detailed schematic cross-sectional view of a substrate in the vicinity of a metal feature.

Barrier layers may also be present in association with the metal features. FIG. 2 depicts an idealized structure which could represent a via 60 connecting a metal line 44 through a dielectric layer 42 to either a lower metallization layer or devices in the substrate. Barrier layer 62 resides between metal line 44 and via 60. Typically via 60 will not be composed of the same metal as the metal used for a metal line 44 or other metal feature. Tungsten is a typical metal used for a structure such as via 60. The barrier layer 62 prevents diffusion of metal atoms from the via into the metal line or vice versa. Similarly, barrier layer 64 resides between via 60 and dielectric layer 42. Barrier layers 62 and 64 may be composed of tungsten nitride, titanium, titanium nitride, titanium silicide, tantalum, tantulum nitride, or other materials which prevent diffusion of metal atoms between unlike materials. Such barrier layers may typically be present at the interface between a metal line or feature and any underlying or adjacent layer, and thus barrier layers may be present in a variety of other locations not depicted in FIG. 2.

Figure 3:
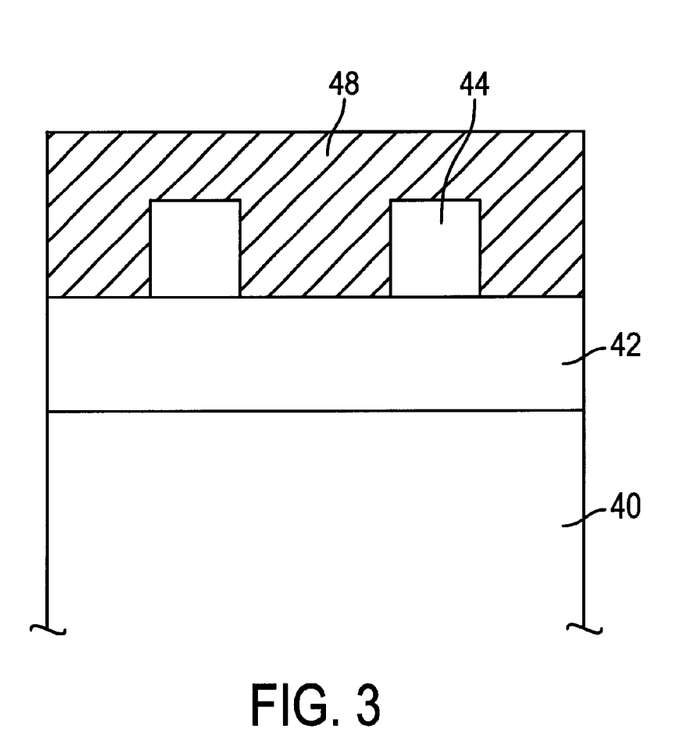
FIG. 3 shows the substrate of FIG. 1 at a processing step subsequent to that shown in FIG. 1.
Figure 4:
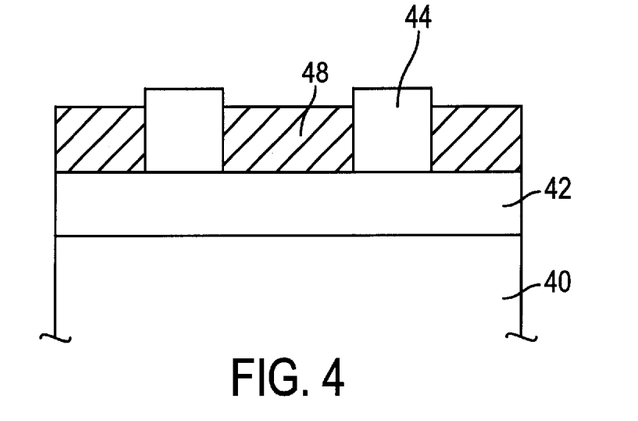
FIG. 4 shows the substrate of FIG. 1 at a processing step subsequent to that shown in FIG. 3.

An embodiment of the present invention is depicted in FIGS. 3 through 6. After formation of metal lines and any associated barrier layers, a blanket layer of a temporary structural solid 48 is formed on the substrate. FIG. 3 depicts the substrate after deposition of a blanket layer of a temporary structural solid 48.

The temporary structural solid 48 may be a photoresist or another polymer or polymer blend which may be readily deposited on a substrate. In a preferred embodiment, the temporary structural solid 48 is a type of photoresist. In a preferred embodiment, the photoresist is a polysilane based resist. Novolak based resists may also be suitable for some applications. In other embodiments, other polymer materials may be used, as long as the polymer is soluble in a suitable supercritical fluid. Suitable supercritical fluids include supercritical $CO_2$ or supercritical ethylene. A supercritical fluid composed of a mixture of two or more substances might also be suitable, such as a mixture of $CO_2$ and an alcohol or a mixture of $CO_2$ and a ketone. The temporary structural solid 48 may be deposited on the substrate by traditional spin-on techniques used for depositing photoresist. In another embodiment the temporary structural solid 48 may be deposited by chemical vapor deposition (CVD). Other methods for depositing the temporary structural solid 48 will be apparent to those skilled in the art.

Preferably, the initial deposition of the photoresist or other polymeric material provides a thick enough layer that the metal lines 44 are completely covered and further provides a surface which has a uniform height. In other words, the resulting surface of the temporary structural solid 48 should have a uniform level without steps, bumps, or other surface features which reflect the topology of the underlying surface. Preferably, this initial deposition results in a known thickness of temporary structural solid 48.

After deposition, an etchback process is used to etch the temporary structural solid 48 so that at least the tops of the metal lines 44 are exposed above the temporary structural solid. In a preferred embodiment depicted in FIG. 4, the temporary structural solid 48 is etched back until the height of the temporary structural solid layer is 80% of the height of the metal lines 44. In a preferred embodiment, the temporary structural solid 48 may be etched back by plasma etching. Other methods of etching back the temporary structural solid, such as chemical mechanical polishing, will be apparent to those skilled in the art. Techniques which etch the temporary structural solid selectively with respect to the metal lines or features are preferred.

Figure 5:
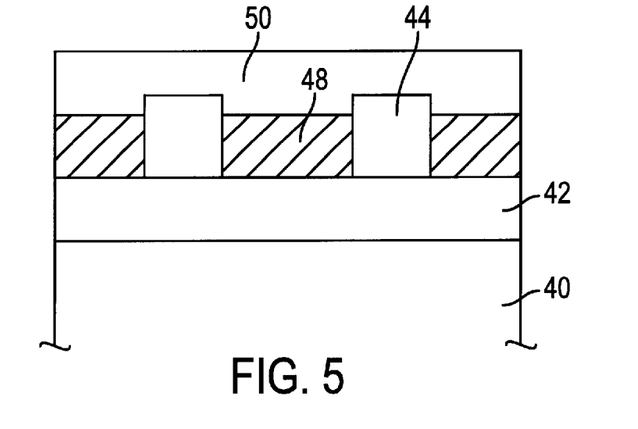
FIG. 5 shows the substrate of FIG. 1 at a processing step subsequent to that shown in FIG. 4.

After formation of the temporary structural solid 48, a porous dielectric 50 is formed on the substrate, as depicted in FIG. 5. Typically the porous dielectric layer 50 will be composed of $SiO_2$, but other dielectric materials may be suitable depending on the application. Preferably, the porous dielectric layer 50 has an average pore size of between approximately 2 nanometers (nm) and approximately 50 nanometers. In a particularly preferred embodiment, the porous dielectric layer 50 has an average pore size of between approximately 5 nm and approximately 30 nm. Preferably, the porous dielectric layer 50 has an average pore density so that the volume of the pores accounts for between approximately 5% and approximately 30% of the total volume of the porous solid.

The porous dielectric layer may be formed on the substrate by spin-on techniques or other suitable methods. The first step in forming a porous dielectric layer on a semiconductor wafer or substrate by a spin-on technique is to prepare an appropriate precursor solution. Suitable precursor solutions are known in the art and examples of suitable solutions can be found in U.S. Pat. No. 4,652,467, incorporated herein by reference. A precursor solution for forming a porous $SiO_2$ layer will be primarily composed of a silicon alkoxide, such as tetraethylorthosilicate (TEOS), a small straight chain alcohol, such as ethanol, and water. Typical solution compositions can range from 25–100 weight parts of silicon alkoxide, 1,000–10,000 weight parts of alcohol, and 10–500 weight parts of water. Either an acid or a base is then added to the solution to begin a condensation reaction which leads to formation of polymers and clusters composed of $SiO_2$ units. As this is a catalysis reaction, only a few weight parts of acid or base are required to initiate the reaction.

After the solution is mixed, the condensation reaction begins. Typically the reaction is enhanced by heating the precursor solution to a temperature between 40 C. and 80 C. As the reaction proceeds, $SiO_2$ units link together to form chains or clusters. If the reaction were allowed to go sufficiently far toward completion, a porous solid would form from the precursor solution. However, as the goal is to create a solution for use in deposition, the reaction is retarded prior to formation of a porous solid. Retardation of the reaction is typically accomplished by reducing the temperature of the solution to below 15 C. At this point, the precursor solution is ready for deposition on the substrate by a spin-on technique. After deposition of the precursor solution, the temperature of the substrate may be raised to above 40 C. to permit formation of the porous dielectric layer.

The composition of the precursor solution has a strong influence on the porous solid that will form after deposition. For example, in acid-catalyzed precursor solutions, decreasing the water content or decreasing the pH will lead to the eventual formation of a porous $SiO_2$ layer with smaller pore sizes on the surface of the substrate.

Typically, porous $SiO_2$ layers are cured after deposition in order to remove excess solvent and to stabilize the structure of the porous solid. Curing must be done in a controlled manner to avoid damaging the structure of the porous $SiO_2$ during removal of the excess solvent. In a preferred embodiment, curing is performed by treating the deposited porous dielectric layer with a supercritical fluid, such as supercritical $CO_2$. Supercritical $CO_2$ is particularly preferred for this embodiment as the excess solvent can be carried away by the supercritical $CO_2$ at relatively low temperatures. In this embodiment, curing the porous dielectric layer and removing the temporary structural solid occur during the same process step. In another embodiment, the supercritical fluid is ethylene. In still other embodiments, the supercritical fluid used for curing the porous dielectric layer may be a mixture of two or more substances. For example, an additional solvent may be added to the $CO_2$. In one embodiment, the supercritical fluid is comprised of a mixture of $CO_2$ and an alcohol. In another embodiment, the supercritical fluid is comprised of a mixture of $CO_2$ and a ketone. Other methods of curing porous dielectric layers may also be used and will be apparent to those skilled in the art.

The resulting porous dielectric layer should be thick enough to electrically isolate adjacent metallization levels as well as to provide structural support for upper layers. In a preferred embodiment, the porous dielectric layer is composed of $SiO_2$ and has a thickness between approximately 50 nm and approximately 300 nm. Other porous dielectric materials may be suitable if they can provide similar structural and dielectric properties.

After formation of the porous dielectric layer, the substrate is exposed to a supercritical fluid. Supercritical fluids form when a substance is subjected to temperature and pressure conditions beyond the critical point for the substance. Supercritical fluids tend to exist under temperature and pressure conditions which are not routinely encountered under normal circumstances. As a result, the physical properties of a given substance at temperature and pressure conditions beyond the supercritical point can vary dramatically from what would be expected of the same substance under conditions closer to room temperature and pressure. Many supercritical fluids exhibit enhanced liquid-like solvation properties while retaining gas-like diffusive properties.

In a preferred embodiment, $CO_2$ is the supercritical fluid. The substrate is treated with $CO_2$ fluid at a pressure of between approximately 70 atmospheres and approximately 200 atmospheres, and a temperature of between approximately 30 C. and approximately 100 C. In a preferred embodiment, the substrate is treated with $CO_2$ fluid at a pressure of between approximately 70 atmospheres and approximately 100 atmospheres and a temperature of between approximately 35 C. and approximately 65 C. The substrate is exposed to the supercritical $CO_2$ until all of the temporary structural solid is extracted through the porous dielectric.

In another embodiment, the supercritical fluid is ethylene. In still other embodiments, the supercritical fluid may be a mixture of two or more substances. For example, an additional solvent may be added to the $CO_2$ in order to enhance dissolution of the temporary structural solid by the supercritical fluid. In one embodiment, the supercritical fluid may be a mixture comprised of $CO_2$ and an alcohol. In another embodiment, the supercritical fluid may be a mixture comprised of $CO_2$ and a ketone.

Figure 6:
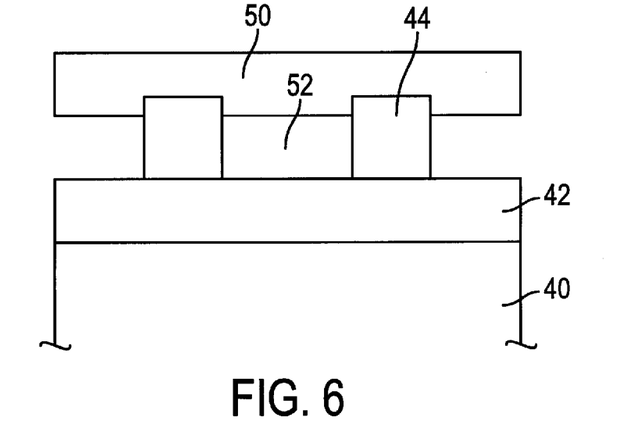
FIG. 6 shows the substrate of FIG. 1 at a processing step subsequent to that shown in FIG. 5.

During the treatment step, the supercritical fluid diffuses through the pores in porous dielectric 50 to reach temporary structural solid 48. The supercritical fluid dissolves the temporary structural solid 48, and the dissolved material diffuses back out through the pores in the porous dielectric layer 50. Preferably, the supercritical fluid does not affect the metal lines 44. After treatment with the supercritical fluid, substantially all of temporary structural solid 48 is removed from gaps 52 between the metal lines or features. FIG. 6 depicts the resulting structure, where air is the primary material in gaps 52 which separate metal lines 44. The porous dielectric layer 50 remains intact and rests on metal lines 44.

After dissolving the temporary structural solid, the extremely fast diffusion rates of the supercritical fluid allow the dissolved solid to be rapidly transported through the pores of the porous dielectric and away from the substrate. Due to the unusual properties of supercritical fluids, the supercritical fluid moves through the pores much more rapidly than a typical solvent, carrying with it any dissolved species such as the dissolved polymer of the temporary structural solid. As a result, supercritical fluids offer superior capabilities as compared to ordinary solvents for extracting dissolved polymer through the pores of the porous dielectric.

Figure 7:
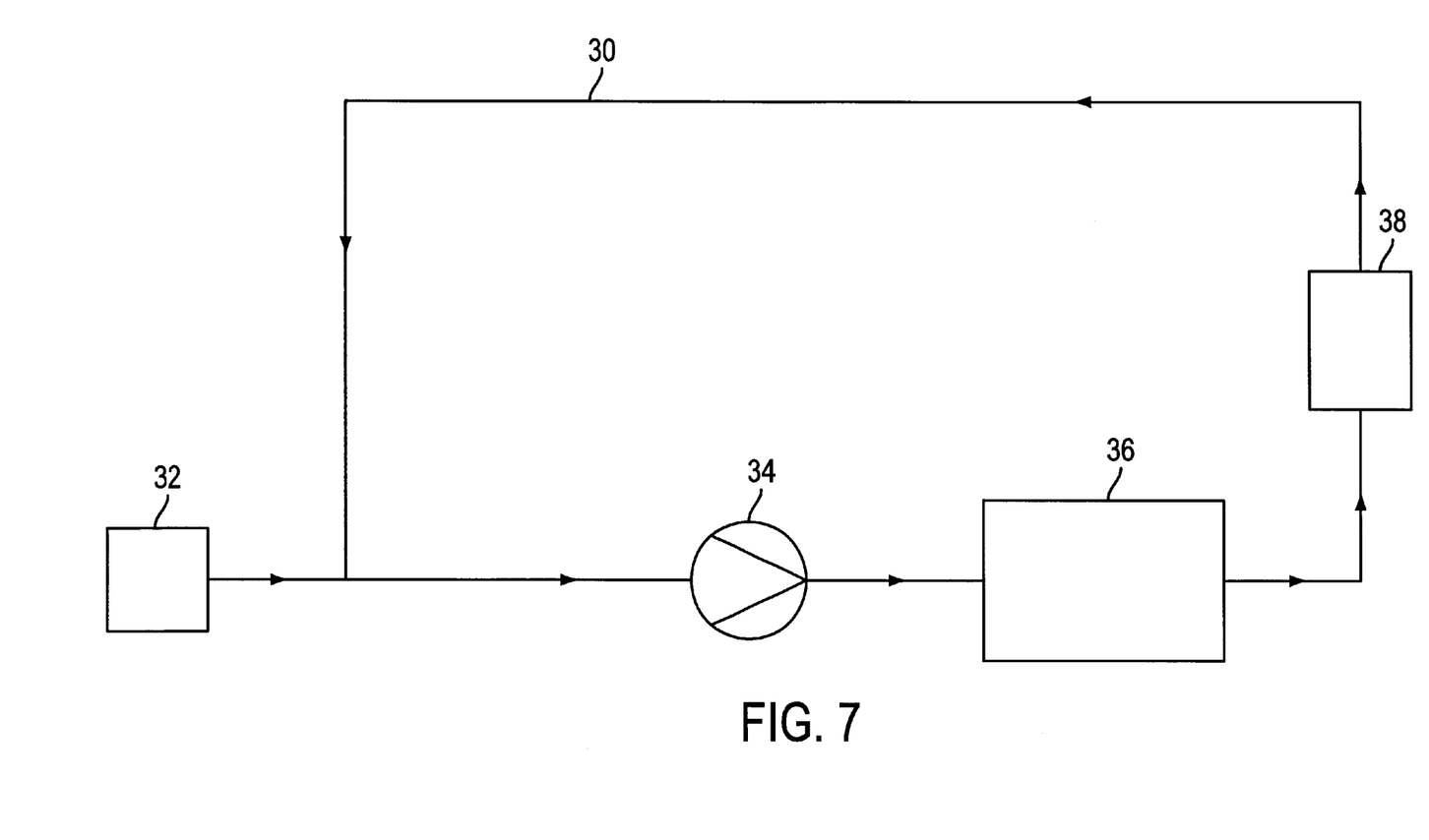
FIG. 7 provides a schematic diagram of an apparatus suitable for treating a wafer with supercritical $CO_2$.

FIG. 7 schematically shows a suitable apparatus for treating one or more substrates with a supercritical fluid. Wafers are treated with supercritical fluid in extraction chamber 36. Supercritical fluid of the desired temperature and pressure may be continuously flowed through the chamber. Extraction chamber 36 may be designed for use as a single wafer chamber or for treatment of multiple wafers at the same time. The pressure of the supercritical fluid delivered to the extraction chamber 36 is controlled by compressor 34. After passing through extraction chamber 36, any dissolved polymer is removed from the fluid in separation chamber 38. In separation chamber 38, the pressure of the supercritical fluid is significantly reduced. This lowers the solubility of the polymer in the supercritical fluid and results in separation of the supercritical fluid and the polymer. As a result of this separation, much of the supercritical fluid can be recycled for further use via recirculation loop 30. Supercritical fluid source 32 provides fresh supercritical fluid for use in the apparatus as necessary.

In a preferred embodiment, $CO_2$ is the supercritical fluid. In this embodiment, the pressure in the extraction chamber is between approximately 70 atmospheres and approximately 200 atmospheres. The pressure in the separation chamber is between approximately 10 atmospheres and approximately 80 atmospheres.

The supercritical fluid treatment step may be carried out on one wafer at a time. Alternatively, multiple wafers may be treated with supercritical fluid at the same time in a batch mode.

In a preferred embodiment, the substrate is treated with a continuous flow of supercritical fluid. In an alternate embodiment, the substrate may be treated with supercritical fluid under static conditions. Flow conditions provide the advantage of carrying dissolved polymer away from the substrate immediately. As a result, the substrate is always exposed to clean supercritical fluid, thus providing for the maximum solubilization of additional polymer. Flow conditions, however, will typically require a recirculation loop as a practical matter to reduce chemical costs. Static treatment conditions reduce the complexity of the required apparatus, as recirculation loop 30 is not needed.

As can be seen from the embodiments described herein, the present invention encompasses processes of creating metallization structures with air as the primary dielectric material separating adjacent metal features. Starting with a substrate with exposed metal lines or features, a temporary structural solid is deposited and etched back to expose at least the top surfaces of the metal lines or features. A porous dielectric layer is then deposited on the substrate and cured. The substrate is then treated with a supercritical fluid to extract the temporary structural solid.

The above description and drawings are only illustrative of preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method for creating metallization levels with a reduced parasitic capacitance on a semiconductor substrate comprising the steps of:
   providing a substrate with exposed metal features;
   forming a temporary structural solid on the substrate;
   forming a porous dielectric layer on said temporary structural solid;
   extracting the temporary structural solid through the pores of the porous dielectric layer by treating said substrate with a supercritical fluid.
2. The method of claim 1, wherein the metal features are comprised of aluminum.
3. The method of claim 1, wherein the metal features are comprised of copper.
4. The method of claim 1, wherein said metal features are further comprised of barrier layers.
5. The method of claim 1, wherein the temporary structural solid is a polymer.
6. The method of claim 1, wherein the temporary structural solid is a photoresist.
7. The method of claim 6, wherein the photoresist is a polysilane resist.
8. The method of claim 6, wherein the photoresist is a novolak-based resist.
9. The method of claim 1, wherein said step of forming the temporary structural solid comprises spin-on deposition.
10. The method of claim 1, wherein the temporary structural solid is deposited by chemical vapor deposition.
11. The method of claim 1, wherein the thickness of the temporary structural solid after deposition is greater than the height of the metal features.
12. The method of claim 1, further comprising etching back the temporary structural solid to expose at least the top surface of the metal features.
13. The method of claim 12, wherein the temporary structural solid is etched back to a height of between approximately 75% and approximately 99% of the height of the metal features.
14. The method of claim 12, wherein the temporary structural solid is etched back to a height of approximately 80% of the height of the metal features.
15. The method of claim 12, wherein the temporary structural solid is etched back by plasma etching.
16. The method of claim 12, wherein the temporary structural solid is etched back by chemical mechanical polishing.
17. The method of claim 1, wherein the porous dielectric is $SiO_2$.
18. The method of claim 1, wherein the porous dielectric layer has an average pore size of between approximately 2 nanometers and approximately 50 nanometers.
19. The method of claim 1, wherein the porous dielectric layer has an average pore size of between approximately 5 nanometers and approximately 30 nanometers.
20. The method of claim 1, wherein the porous dielectric layer has a pore density of between approximately 5% and approximately 30% on a volume basis.

21. The method of claim 1, wherein the thickness of the porous dielectric layer is between approximately 50 nanometers and approximately 300 nanometers.

22. The method of claim 1, wherein the supercritical fluid is $CO_2$.

23. The method of claim 22, wherein the substrate is treated with supercritical fluid at a pressure of between approximately 70 atmospheres and approximately 200 atmospheres.

24. The method of claim 22, wherein the substrate is treated with supercritical fluid at a pressure of between approximately 70 atmospheres and approximately 100 atmospheres.

25. The method of claim 22, wherein the substrate is treated with supercritical fluid at a temperature of between approximately 30 C. and approximately 100 C.

26. The method of claim 22, wherein the substrate is treated with supercritical fluid at a temperature of between approximately 35 C. and approximately 65 C.

27. The method of claim 1, wherein the supercritical fluid is ethylene.

28. The method of claim 1, wherein the supercritical fluid is comprised of a mixture of two or more substances.

29. The method of claim 1, wherein the supercritical fluid is comprised of $CO_2$ and an additional solvent.

30. The method of claim 29, wherein the additional solvent is an alcohol.

31. The method of claim 29, wherein the additional solvent is a ketone.

32. The method of claim 1, wherein supercritical fluid is continuously flowed past the substrate during treatment of the substrate with the supercritical fluid.

33. The method of claim 1, wherein the substrate is treated with supercritical fluid under static conditions.

34. The method of claim 1, wherein said step of forming a porous dielectric layer further comprises curing said porous dielectric layer to remove excess alcohol from the porous dielectric layer.

35. The method of claim 34, wherein said curing of porous dielectric layer is accomplished by treating the porous dielectric layer with a supercritical fluid.

36. The method of claim 35, wherein the supercritical fluid is $CO_2$.

37. The method of claim 35, wherein the supercritical fluid is ethylene.

38. The method of claim 35, wherein the supercritical fluid is comprised of a mixture of two or more substances.

39. The method of claim 35, wherein the supercritical fluid is comprised of $CO_2$ and an additional solvent.

40. The method of claim 39, wherein the additional solvent is an alcohol.

41. The method of claim 39, wherein the additional solvent is a ketone.

42. The method of claim 35, wherein said curing of the porous dielectric layer and said extraction of the temporary structural solid occur during a single process step.

43. A method of extracting a temporary structural solid through a porous dielectric comprising the steps of:
providing a substrate with a temporary structural solid and a porous dielectric layer formed above the temporary structural solid;
exposing the substrate to a supercritical fluid for a time sufficient to extract the temporary structural solid through the pores of the porous dielectric layer.

44. The method of claim 43, wherein the temporary structural solid is a polymer.

45. The method of claim 43, wherein the temporary structural solid is a photoresist.

46. The method of claim 43, wherein the supercritical fluid is $CO_2$.

47. The method of claim 46, wherein the substrate is exposed to the supercritical fluid at a pressure of between approximately 70 atmospheres and approximately 200 atmospheres.

48. The method of claim 46, wherein the substrate is exposed to the supercritical fluid at a pressure between approximately 70 atmospheres and 100 atmospheres.

49. The method of claim 46, wherein the substrate is exposed to the supercritical fluid at a temperature of between 30 C. and 100 C.

50. The method of claim 46, wherein the substrate is exposed to the supercritical fluid at a temperature of between 35 C. and 65 C.

51. The method of claim 43, wherein the supercritical fluid is ethylene.

52. The method of claim 43, wherein the supercritical fluid is comprised of a mixture of two or more substances.

53. The method of claim 43, wherein the supercritical fluid is comprised of $CO_2$ and an additional solvent.

54. The method of claim 53, wherein the additional solvent is an alcohol.

55. The method of claim 53, wherein the additional solvent is a ketone.

56. The method of claim 43, wherein the substrate is exposed to a continuous flow of supercritical fluid.

57. The method of claim 43, wherein the substrate is exposed to the supercritical fluid under static conditions.

58. The method of claim 43, wherein the porous dielectric layer is $SiO_2$.

59. The method of claim 43, wherein the thickness of the porous dielectric layer is between approximately 50 nanometers and approximately 300 nanometers.

60. The method of claim 43, wherein the average pore size of the porous dielectric layer is between approximately 2 nanometers and approximately 50 nanometers.

61. The method of claim 43, wherein the average pore size of the porous dielectric layer is between approximately 5 nanometers and approximately 30 nanometers.

62. The method of claim 43, wherein the porous dielectric has a pore density of between approximately 5% and 30% on a volume basis.

63. The method of claim 43, wherein the substrate also comprises metal features in layers underneath the porous dielectric layer.

64. A method for creating metallization layers with reduced parasitic capacitance comprising the steps of:
providing a substrate with exposed metal features;
depositing a temporary structural solid over the substrate and the exposed metal features;
etching back the temporary structural solid to expose at least the top of the metal features;
depositing a solution for forming a porous dielectric layer on the substrate;
activating the solution for forming a porous dielectric layer to cause formation of the porous dielectric; and
exposing the substrate to a supercritical fluid to cure the porous dielectric layer and remove the temporary structural solid by extraction through the pores of the porous dielectric layer.

65. The method of claim 64, wherein the supercritical fluid is $CO_2$.

66. The method of claim 65, wherein the substrate is exposed to supercritical fluid at a pressure of between approximately 70 atmospheres and approximately 200 atmospheres.

67. The method of claim 65, wherein the substrate is exposed to supercritical fluid at a pressure of between approximately 70 atmospheres and approximately 100 atmospheres.

68. The method of claim 65, wherein the substrate is exposed to supercritical fluid at temperature of between approximately 30 C. and approximately 100 C.

69. The method of claim 65, wherein the substrate is exposed to supercritical fluid at a temperature of between approximately 35 C. and approximately 65 C.

70. The method of claim 64, wherein the supercritical fluid is ethylene.

71. The method of claim 64, wherein the supercritical fluid is comprised of a mixture of two or more substances.

72. The method of claim 64, wherein the supercritical fluid is comprised of $CO_2$ and an additional solvent.

73. The method of claim 72, wherein the additional solvent is an alcohol.

74. The method of claim 72, wherein the additional solvent is a ketone.

75. The method of claim 64, wherein the substrate is exposed to a continuous flow of supercritical fluid.

76. The method of claim 64, wherein the substrate is exposed to the supercritical fluid under static conditions.

77. The method of claim 64, wherein the temporary structural solid is a polymer.

78. The method of claim 64, wherein the temporary structural solid is a photoresist.

79. The method of claim 64, wherein the temporary structural solid is etched back to between approximately 75% and approximately 99% of the height of the metal features.

80. The method of claim 64, wherein the temporary structural solid is etched back to approximately 80% of the height of the metal features.

81. The method of claim 64, wherein the porous dielectric layer is $SiO_2$.

82. The method of claim 64, wherein the thickness of the porous dielectric layer is between approximately 50 nanometers and approximately 300 nanometers.

83. The method of claim 64, wherein the average pore size of the porous dielectric layer is between approximately 2 nanometers and approximately 50 nanometers.

84. The method of claim 64, wherein the average pore size of the porous dielectric layer is between approximately 5 nanometers and approximately 30 nanometers.

85. The method of claim 64, wherein the porous dielectric has a pore density of between approximately 5% and 30% on a volume basis.

86. A method for creating metallization layers with reduced parasitic capacitance comprising the steps of:

providing a substrate;

depositing a blanket layer of metal on the substrate;

patterning the metal layer to create metal features on the substrate;

depositing a temporary structural solid on the substrate;

etching back the temporary structural solid to expose at least the top of the metal features;

depositing a porous dielectric layer on the substrate;

curing the dielectric layer;

treating the substrate with supercritical $CO_2$ until the temporary structural solid is extracted through the pores of the porous dielectric.

87. A method for creating metallization layers with reduced parasitic capacitance comprising the steps of:

providing a substrate;

forming metal features and associated barrier layers on said substrate;

forming a temporary structural solid on the substrate;

forming a porous dielectric layer on the substrate;

treating the substrate with supercritical $CO_2$ until the temporary structural solid is extracted through the pores of the porous dielectric layer.

* * * * *